US008018136B2

(12) United States Patent
Gingrich, III et al.

(10) Patent No.: US 8,018,136 B2
(45) Date of Patent: Sep. 13, 2011

(54) INTEGRATED LED DRIVER FOR LED SOCKET

(75) Inventors: Charles Raymond Gingrich, III, Mechanicsburg, PA (US); Christopher George Daily, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 281 days.

(21) Appl. No.: 12/372,823

(22) Filed: Feb. 18, 2009

(65) Prior Publication Data

US 2009/0218923 A1 Sep. 3, 2009

Related U.S. Application Data

(60) Provisional application No. 61/032,317, filed on Feb. 28, 2008.

(51) Int. Cl.
*H01L 33/00* (2010.01)
*F21V 19/00* (2006.01)
*F21V 29/00* (2006.01)

(52) U.S. Cl. ..... 313/498; 313/512; 313/46; 362/249.02; 362/373; 257/712

(58) Field of Classification Search .................. 313/512
See application file for complete search history.

(56) References Cited

U.S. PATENT DOCUMENTS

| | | | | |
|---|---|---|---|---|
| 6,150,774 | A | 11/2000 | Mueller et al. | |
| 6,764,345 | B1 * | 7/2004 | Duesterhoeft et al. | 439/637 |
| 6,787,999 | B2 * | 9/2004 | Stimac et al. | 315/51 |
| 7,806,575 | B2 * | 10/2010 | Willwohl et al. | 362/547 |
| 2006/0002125 | A1 * | 1/2006 | Kim et al. | 362/509 |
| 2007/0070645 | A1 * | 3/2007 | Coushaine et al. | 362/555 |
| 2007/0279921 | A1 * | 12/2007 | Alexander et al. | 362/368 |
| 2008/0025028 | A1 | 1/2008 | Gloisten et al. | |

FOREIGN PATENT DOCUMENTS

| | | | |
|---|---|---|---|
| EP | 382038 | A1 * | 8/1990 |
| WO | WO 2005/025935 | | 3/2005 |

OTHER PUBLICATIONS

PCT International Search Report; International Application No. PCT/US2009/001222; International Filing Date Feb. 26, 2009.

* cited by examiner

*Primary Examiner* — Sikha Roy

(57) ABSTRACT

A mounting assembly for supporting an LED in a lighting fixture. A first substrate containing the LED has contact pads in electrical communication with the LED. A contact carrier has a plurality of contacts that correspond with the contact pads of the first substrate. A second substrate has electronic components to power the LED. A first contact arrangement on the second substrate engages the integral electrical contact portions of the contact carrier, and a second contact arrangement provides external connections to the electronic components. A heat sink portion is engaged in thermal contact with the contact carrier and the first substrate. The heat sink portion includes finned members for dissipation of heat generated by the LED disposed within the heat sink portion. A slot is provided in the heat sink projecting axially of the heat sink portion, for receiving and securing the second substrate.

18 Claims, 4 Drawing Sheets

INTEGRATED LED DRIVER FOR LED SOCKET

CROSS REFERENCE TO RELATED APPLICATIONS

This application claims the benefit of U.S. Provisional Application No. 61/032,317 entitled INTEGRATED LED DRIVER FOR LED SOCKET filed Feb. 28, 2008.

FIELD OF THE INVENTION

The present invention is directed to electronic components, and more particularly to a universal socket assembly having an integral driver assembly for light emitting diodes (LEDs).

BACKGROUND OF THE INVENTION

High intensity LEDs may be used for general-purpose illumination, and in specialty lighting applications such as architectural and video display applications. Some manufacturers design LED lighting assemblies that are customized for specific devices.

Since LEDs are current driven devices, most LEDs require a constant source of current to properly operate. A separate LED driver assembly is required to regulate a constant current to the LED. The LED driver assembly is a separate unit, which is mounted on the lighting fixture remote from the LED and then wired to the remote LED. The labor and hardware that are required for mounting and wiring an LED driver assembly can be a disadvantage in the manufacturing and installation of the LED lighting fixture. The labor and hardware required for mounting and wiring the fixture may also present an obstacle when designing an elegant, stream lined lighting fixture that incorporates the LED.

What is needed is a driver assembly that attaches integrally to a standard LED lighting socket, or LED pixel holder, for high-intensity LEDs, which driver assembly integrates electrical and thermal connections in a single receptacle. Other features and advantages will be made apparent from the present specification. The teachings disclosed extend to those embodiments that fall within the scope of the claims, regardless of whether they accomplish one or more of the aforementioned needs.

SUMMARY OF THE INVENTION

In one embodiment, the present invention is directed to an LED mounting assembly for a lighting fixture including a first substrate including one or more LEDs mounted thereon, and a plurality of contact pads in electrical communication with the LED. A contact carrier includes a plurality of integral electrical contact portions arranged about a perimeter of the contact carrier. The plurality of integral electrical contact portions correspond with the plurality of electrical contact pads of the first substrate. A second substrate includes electronic components configured to power the LED. The second substrate includes a first contact arrangement that engages the integral electrical contact portions of the contact carrier, and a second contact arrangement to engage external connections to the electronic components. A heat sink portion is retentively engageable in thermal communication with the contact carrier and the first substrate.

Additional embodiments are contemplated within the scope of the following detailed specification.

An advantage of the present invention is a printed circuit (PC) board assembly with a constant current driver circuit that is integrated directly into an LED pixel assembly.

Another advantage is a PC driver board that can be easily, quickly and integrally assembled into an LED pixel assembly, and does not require a solder or thermal adhesive connection to the LED pixel assembly.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Commonly assigned U.S. patent application Ser. No. 11/742,611, filed May 1, 2007, discloses an exemplary mounting assembly for supporting high intensity LEDs in a lighting fixture, for use with the integrated driver socket, and the same is hereby incorporated by reference in its entirety.

Figure 1:
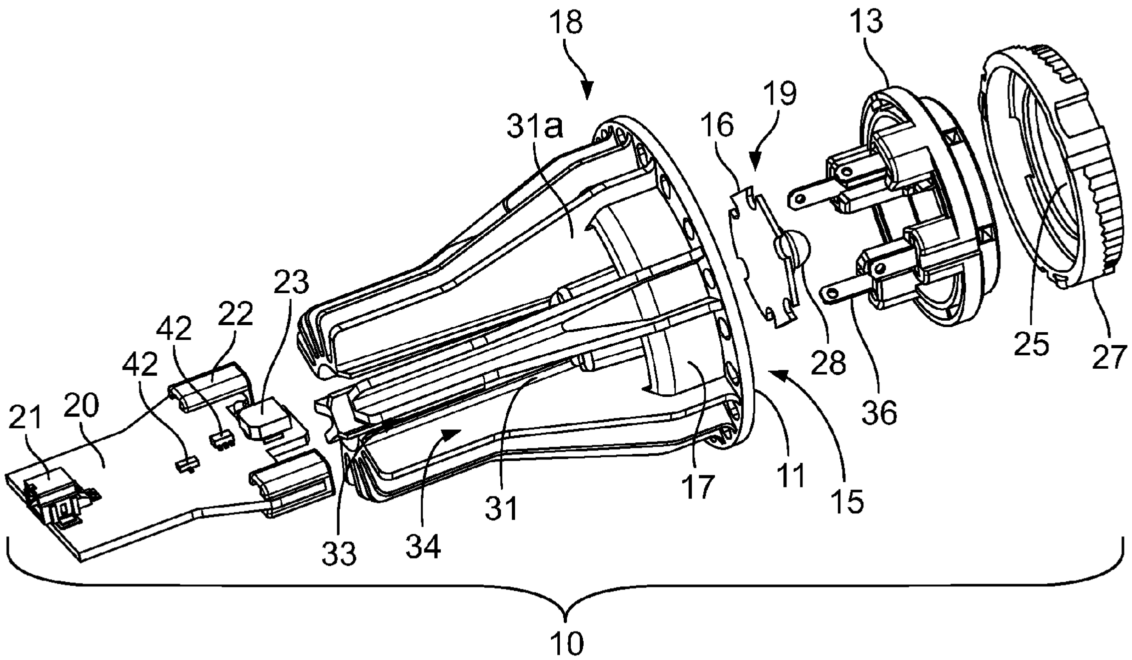
FIG. 1 is an exploded view of an exemplary LED socket and integral LED driver.
Figure 7:
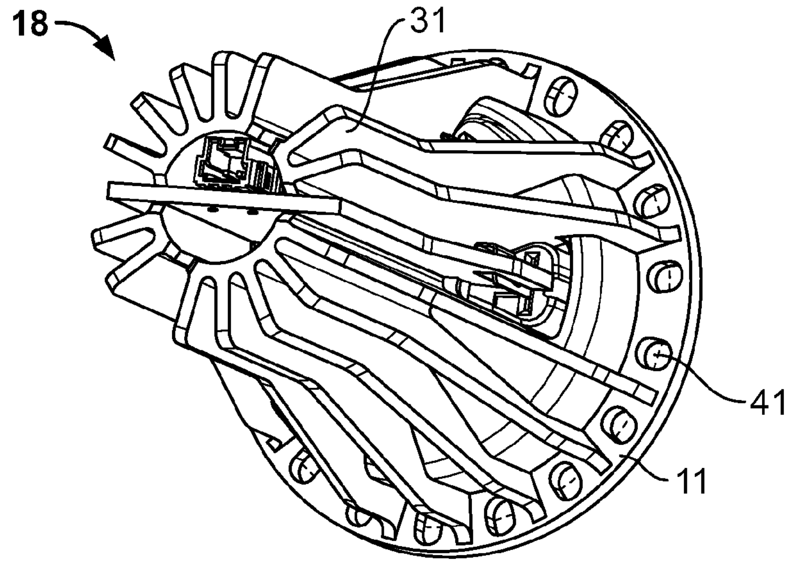
FIG. 7 is a perspective view of an exemplary assembled LED socket including the integral driver.

Referring to FIG. 1 and FIG. 7, an exemplary embodiment of an LED connector assembly 10 has a heat sink 18 with a fluted or finned body that provides additional surface area for dissipating heat. Heat sink 18 is designed with a complementary outer ring 11, similar to conventional halogen bulbs, e.g., types GU10 or MR16 standard bulbs, which have outer rings on the reflector assembly that permit the LED connector assembly 10 to be interchangeable with conventional bulbs. In another embodiment, a threaded rear portion (not shown) of heat sink 18 may be provided that threads into a threaded lighting fixture (not shown). An LED 28 is mounted on a printed circuit board (PCB) substrate or assembly 16. LED PCB assembly 16 rests within a cavity 15 configured to receive LED PCB assembly 16. Cavity 15 is defined by a circumferential wall 17 disposed at one end of individual fin portions 31 projecting radially inward from the outer radius of heat sink 18. Contacts 36 are inserted into a contact carrier 13. Contacts 36 extend into channels 33 defined by fin portions 31. Fin portions 31 dissipate radiant heat to the ambient air circulating in the spaces or channels 34 defined by adjacent fin portions 31.

The number of contacts 19 of LED PCB assembly 16 depends on the number of LEDs 28 that are mounted on LED PCB assembly 16. An LED PCB assembly 16 includes two contact pads 19 for an LED PCB assembly 16 with a single LED 28, and an LED PCB 16 assembly containing three LEDs 28 includes four contact pads 19, although various LED interconnections may be used. E.g., red, green, blue (RGB) LEDs include three LEDs, which share a common anode connection, such that four contact pads 19 are sufficient to power the three LEDs. The number of contacts 36 shown in the drawings is exemplary only, and is not intended to limit the scope of the invention. Contact carrier 13 may be inserted into a cavity 15 disposed at one end of heat sink 18. Contact carrier 13 fits into cavity 15 and makes thermal contact against LED PCB assembly 16 to maintain LED PCB assembly 16 in position within cavity 15. A locking ring 27 fits over contact carrier 13 and ratchets into place under a flange portion 11 to secure contact carrier 13 and an optional transparent lens (not shown). Locking ring 27 has an aperture 25 to allow light penetration. LED PCB assembly 16 is secured in position by the locking ring. Locking ring 27 urges contacts 36 against contact pads 19 for positive electrical contact and urges LED PCB assembly 16 into thermal contact with heat sink 18. Contact carrier 13 includes contacts 36 for mating with LED PCB contact pads 19. LED PCB 16 is maintained by locking ring 27 in thermal contact or communication with heat sink 18.

Figure 2:
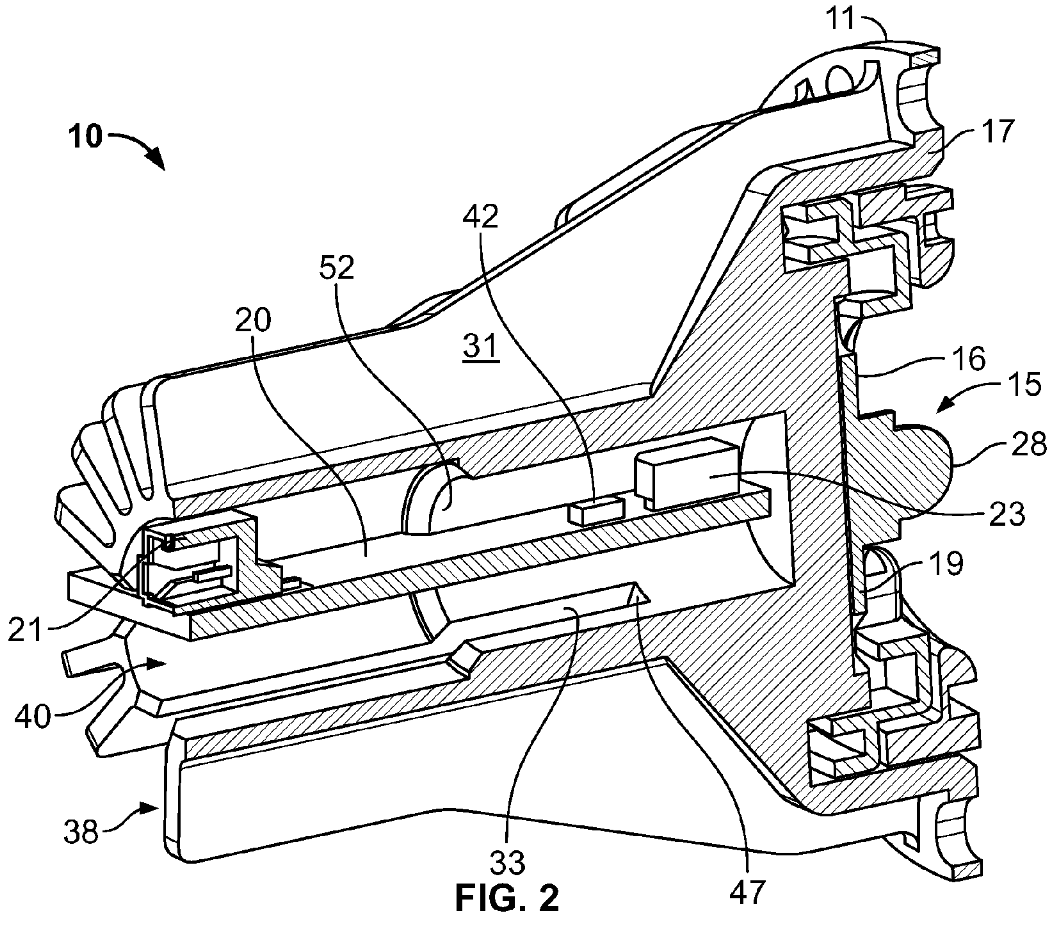
FIG. 2 is a cross-sectional view through the center of the LED socket taken perpendicular to the integral driver board of FIG. 1.
Figure 3:
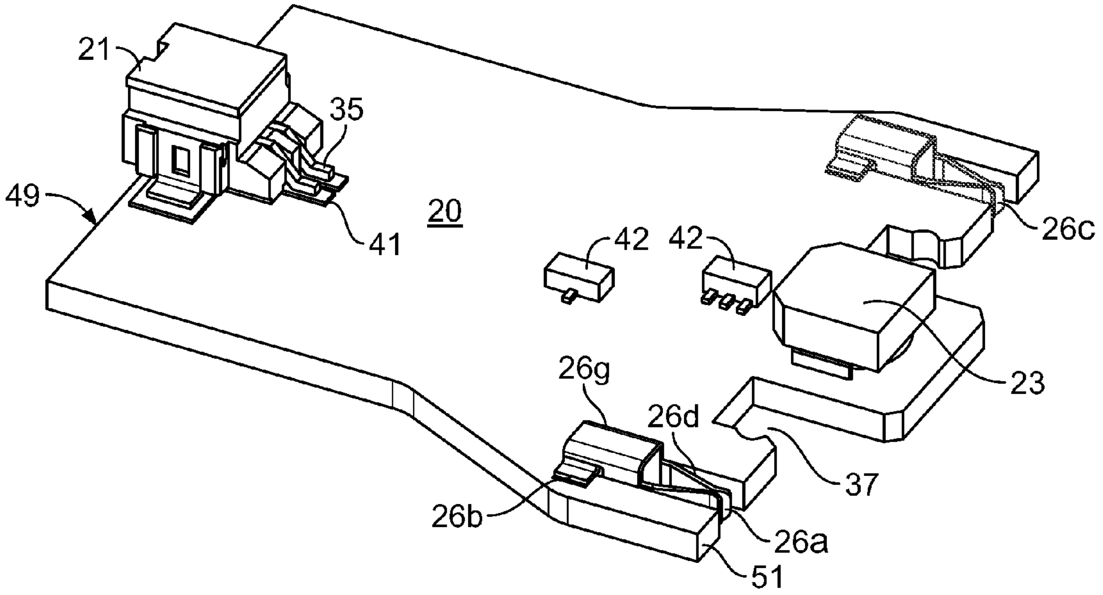
FIG. 3 is a perspective view of the LED driver card of FIG. 1.

Referring next to FIGS. 2 and 3, channels 34*a*-34*d* (See, e.g., FIG. 5) extend along an axial core aperture 40 from a distal end 38 of heat sink 18, in the direction of flange portion 11. An LED driver card 20 is inserted into guide slots 33 on opposite sides of axial core aperture 40. Guide slots 33 are configured to receive LED driver card 20. A pair of mating slots 37 are provided in LED driver card 20. Mating slots 37 correspond with end walls 47 in guide slots 33 to limit the travel of LED driver card 20 in guide slots 33 and position LED driver card 20 for receiving contacts 36 in receptacle portions 26, located adjacent to mating slots 37. Retention of LED driver card 20 is achieved by engagement of recesses 37*a* with corresponding detent ridges located on heat sink 18. (See, e.g., FIG. 4)

LED driver card 20 includes integrated circuits (not shown), which regulate various electrical and electronic parameters such as constant current and voltage applied to LED PCB 16. An external connector 21 is positioned adjacent a rear edge 49 of LED driver card 20. Receptacle portions 26 are positioned adjacent an opposite edge 51 of LED driver card 20. External connector 21 includes leads 35 that connect to printed circuit pads 41, e.g., by soldering, for interconnecting an external power source to internal trace conductors of LED driver card 20. External connector 21 may be a CT (common terminal) connector, such as manufactured by Tyco Electronics Co. of Middletown, Pa., or any suitable PCB connector. Electronic components commonly referred to in the electronics industry as surface mounted technology (SMT) components 23, 42 are mounted on LED driver card 20. SMT components 23, 42, contain driver integrated circuits and passive electronic components for powering and controlling LED PCB 16. SMT components 42, 23, fit inside the core aperture with sufficient clearance to avoid interference from an inner wall 52 when LED driver card 20 is inserted therein.

Receptacle portions 26 include spring arms 26*a* at the leading edge for receiving contacts 36. Spring arms 26*a* have opposing leaf portions 26*d* that converge inwardly to a contact region 26*f* (see, e.g., FIG. 4), and then diverge outwardly at the distal end to form a guide region in which contact 36 enters receptacle portion 26. A pair of panels 26*b* project laterally from receptacle portion 26 from a hollow frame portion 26*g*. The hollow frame portion 26*g* surrounds contact 36 to constrain movement of contact 36 within hollow frame portion 26*g*, thereby avoiding short circuiting contact 36 to heat sink 18 or to traces or other conductive surfaces on LED driver card 20. Receptacle portion 26 shown is merely one embodiment, and other connector arrangements, e.g., card edge connectors (FIGS. 8 & 9) or others, may be used within the scope of the appended claims.

Figure 4:
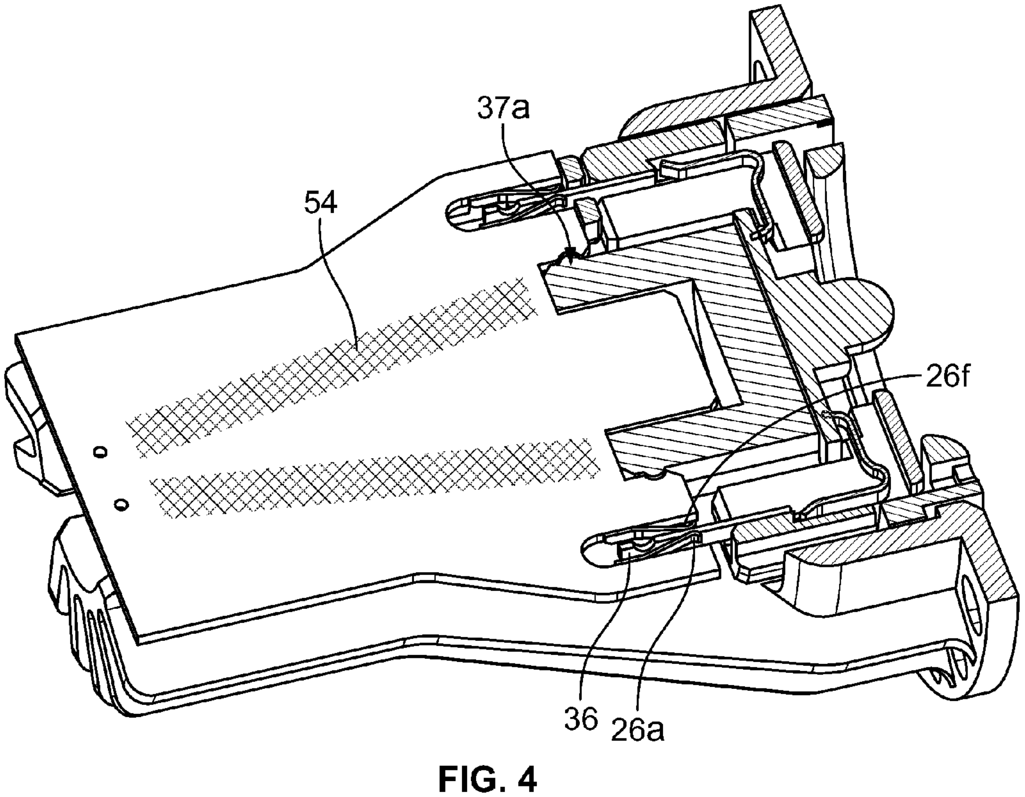
FIG. 4 is a cross-sectional view through the center of the LED socket and LED driver card in FIG. 1.

Referring to FIG. 4, LED driver card 20 includes surface regions 54 which are free of printed circuit traces (not shown) on the surface, as indicated in the drawing by cross-hatching. Surface regions 54 are provided in proximity to the inner wall 52 and LED driver card 20 interface in slot 33, to prevent possible short circuits between the traces and heat sink 18.

Figure 5:
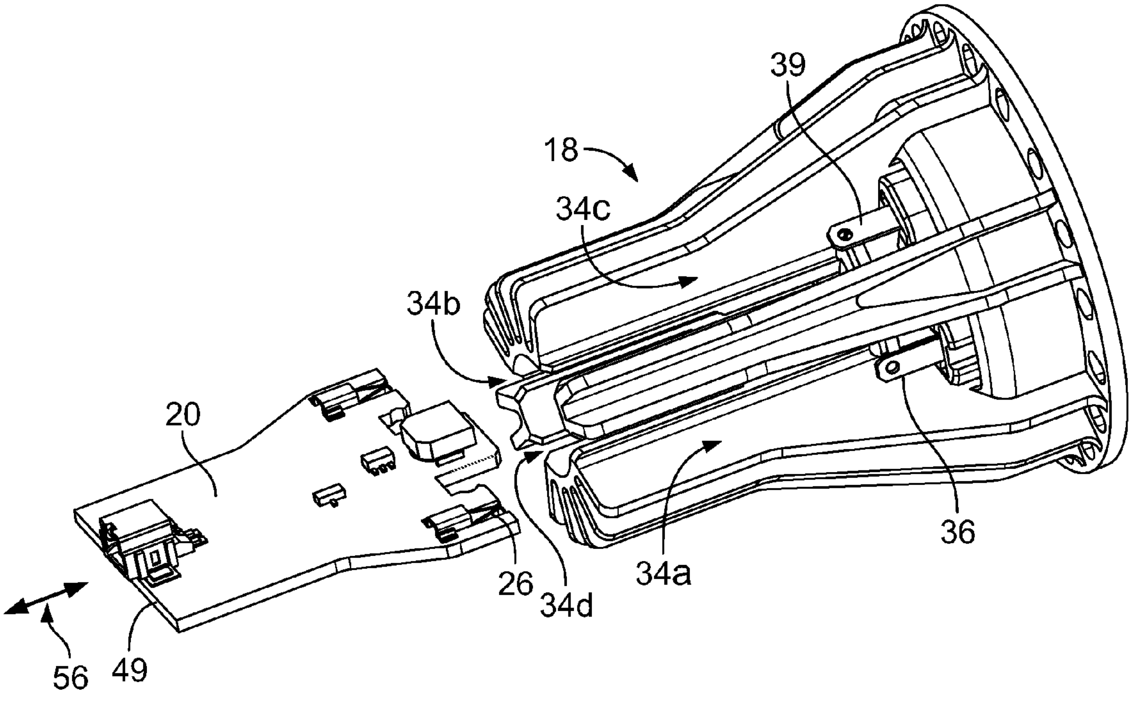
FIG. 5 is a view of one embodiment showing the LED driver card being inserted into the LED socket.

Referring next to FIG. 5, LED driver card 20 is shown as it is being inserted in to and/or removed from heat sink 18, the direction of movement being indicated by arrow 56. The receptacle portions 26 mate with contacts 36 when using the opposite pair of channels designated as 34*a* and 34*b*. A second pair of channels 34*c*, 34*d* are arranged in alignment with a second set of contacts 39, at approximately 30° axial rotation from the plane intersecting channels 34*a*, 34*b*. LED driver card 20 may be selectively inserted in either pair of channels 34*a*, 34*b*, or 34*c*, 34*d*, e.g., where two different color LEDs are provided on LED PCB 16. Alternatively, contacts 36, 39 and associated channels 34*a*-34*d* may be configured with rejection features to accept different style boards for driving different components on LED PCB 16. The two positions associated with channel pairs 34*a*, 34*b* and 34*c*, 34*d*, allow for flexibility to connect to different pad configurations on LED PCB 16.

Figure 6:
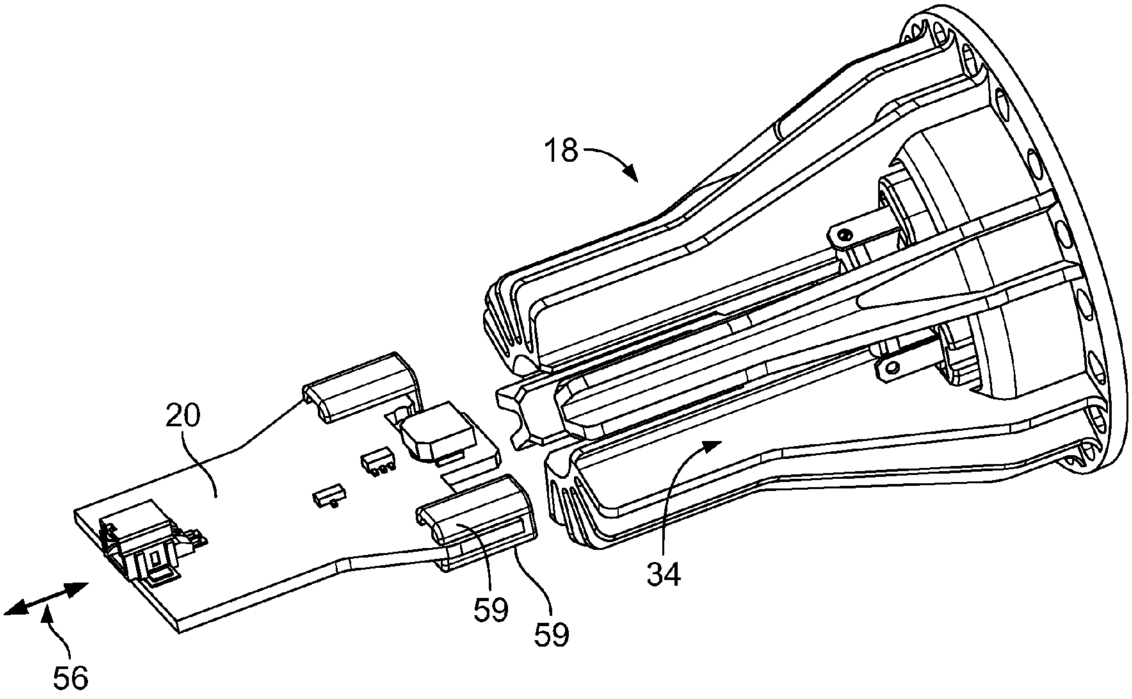
FIG. 6 is an alternate embodiment showing the LED driver card being inserted into the LED socket.

Referring next to FIG. 6, an alternate embodiment of LED driver card 20 is shown. The embodiment of FIG. 6 is similar to that of FIG. 5, wherein LED driver card 20 includes an alternative receptacle 26 having an external insulating shell 59 that insulates receptacle 26 from electrical contact with heat sink 18. The insertion movement indicated by arrow 56 and channels 34 operate in the same manner as described above with respect to FIG. 5.

Figure 8:
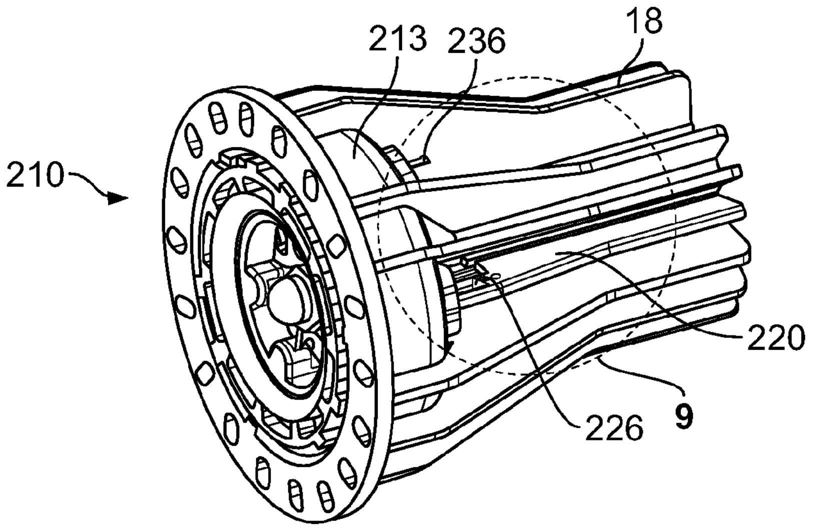
FIG. 8 is perspective view of an alternate embodiment having an LED driver card with an edge connector.
Figure 9:
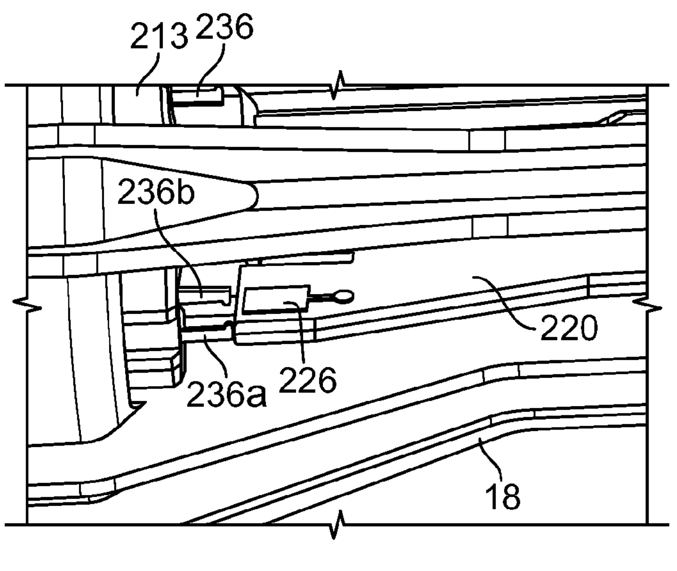
FIG. 9 is an enlarged sectional view of the area designated in FIG. 8 by a broken line 9.

Referring next to FIGS. 8 and 9, in an alternate embodiment an LED driver card 220 and a contact carrier 213 are connected by a card edge connector arrangement. An LED driver card 220 includes contact pads 226 on upper and lower sides of LED driver card 220, which mate with contact 236. A pair of contact beams 236*a* and 236*b* form a furcated contact 236 that pinches contact pads 226 of LED driver card 220 in a friction fit.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. An LED connector assembly for a lighting fixture comprising:

a first substrate comprising at least one LED mounted thereon, and a plurality of contact pads in electrical communication with the at least one LED;

a contact carrier comprising a plurality of integral electrical contact portions arranged about a perimeter of the contact carrier, the plurality of integral electrical contact portions corresponding to the plurality of electrical contact pads of the first substrate;

a second substrate comprising electronic components configured to power the at least one LED, a first contact arrangement configured to engage the integral electrical contact portions of the contact carrier, and a second contact arrangement for external connections to the electronic components; and a heat sink portion retentively engageable in thermal communication with the carrier and the first substrates wherein the heat sink further comprises:

a first pair of channels to direct the second substrate into electrical communication with a first pair of contact portions of the plurality of integral electrical contact portions; and a second pair of channels to direct the second substrate into electrical communication with a second pair of contact portions of the plurality of integral electrical contact portions; and wherein the first pair of channels is offset from the second pair of channels approximately 30° axial rotation, and the second substrate is selectively insertable in either of the first pair of channels or the second pair of channels.

2. The assembly of claim 1, wherein the heat sink portion extends longitudinally from the contact carrier.

3. The assembly of claim 1, wherein the heat sink comprises a plurality of finned members for dissipation of heat generated by the first substrate.

4. The assembly of claim 3, wherein the second substrate is an LED driver card, the LED driver card comprising at least one surface region free of printed circuit traces, the at least one surface region disposed adjacent an inner wall of at least one of the finned members, where the LED driver card and the inner wall are adjacent.

5. The assembly of claim 1, further comprising at least one slot, the at least one slot projecting at least a portion of an axial length of the heat sink portion for integrally receiving the second substrate in electrical communication with the first substrate.

6. The assembly of claim 1, further comprising a cavity defined by a circumferential wall disposed at one end of the heat sink, the cavity configured to receive the first substrate.

7. The assembly of claim 6, wherein the contact carrier fits into the cavity in thermal contact against the first substrate to maintain the first substrate within cavity.

8. The assembly of claim 7, further comprising a locking ring defining an aperture, the locking ring attachable to the contact carrier.

9. The assembly of claim 8, wherein the first substrate urges the plurality of integral electrical contact portions into electrical contact with the contact pads, and into thermal communication with the heat sink.

10. The assembly of claim 1, wherein the first pair and the second pair of channels are defined by fin portions configured to dissipate radiant heat.

11. The assembly of claim 1, wherein the at least one LED comprises three LEDs, each LED having an anode connected in common and an isolated cathode, the first substrate further comprising four contact pads for connecting each LED of the three LEDs to an external circuit.

12. The assembly of claim 1, wherein the second contact arrangement of the second substrate further comprises an external connector positioned adjacent a first edge of the second substrate, the external connector comprising wire leads connected to printed circuit pads, the external connector configured for interconnecting an external power source to at least one trace conductor etched in the second substrate.

13. The assembly of claim 12, wherein the second substrate further comprises at least one receptacle portion positioned adjacent a second edge of the second substrate.

14. The assembly of claim 12, the second substrate further comprising a plurality of surface mounted electronic components configured to power and control the at least one LED.

15. The assembly of claim 14, wherein the electronic components comprise at least one of a driver integrated circuit and a passive electronic component.

16. The assembly of claim 12, wherein the second substrate further comprises a plurality of receptacle portions, at least one receptacle portion including a pair of opposing spring arms disposed at a leading edge for receiving at least one of the integral electrical contact portions; the spring arms comprising opposing leaf portions converging to a contact region, and diverging outwardly at a distal end to guide the integral electrical contact portion into the receptacle portion.

17. The assembly of claim 16, wherein at least one receptacle portion of the plurality of receptacle portions further comprises a frame portion surrounding at least a portion of at least one integral electrical contact portion, the frame portion configured to constrain movement of the integral electrical contact portion within the frame portion.

18. The assembly of claim 1, wherein the second substrate is connected with the contact carrier by an edge connector, the first contact arrangement comprising an upper contact pad and a lower contact pad disposed on opposite sides of the second substrate, the upper contact pad and a lower contact pad mateable with the plurality of integral electrical contact portions; and the contact carrier further comprising a furcated contact arrangement configured to engage the contact pads of the second substrate.

* * * * *